United States Patent
Park et al.

(10) Patent No.: US 10,447,411 B2
(45) Date of Patent: Oct. 15, 2019

(54) ACOUSTIC WAVE DEVICE AND METHOD OF MANUFACTURING THE SAME

(71) Applicant: SAMSUNG ELECTRO-MECHANICS CO., LTD., Suwon-si (KR)

(72) Inventors: Seung Wook Park, Suwon-si (KR); No Il Park, Suwon-si (KR); Tae Sung Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 497 days.

(21) Appl. No.: 15/174,316

(22) Filed: Jun. 6, 2016

(65) Prior Publication Data

US 2017/0063335 A1   Mar. 2, 2017

(30) Foreign Application Priority Data

Aug. 25, 2015   (KR) .................. 10-2015-0119752
Mar. 16, 2016   (KR) .................. 10-2016-0031386

(51) Int. Cl.
| | | |
|---|---|---|
| *H04B 11/00* | (2006.01) | |
| *H03H 3/08* | (2006.01) | |
| *H03H 9/05* | (2006.01) | |
| *H03H 9/10* | (2006.01) | |

(52) U.S. Cl.
CPC .......... *H04B 11/00* (2013.01); *H03H 3/08* (2013.01); *H03H 9/059* (2013.01); *H03H 9/1014* (2013.01); *H03H 9/1071* (2013.01); *H03H 9/1085* (2013.01); *H01L 2224/16225* (2013.01); *H01L 2924/15311* (2013.01); *H01L 2924/181* (2013.01); *H01L 2924/19105* (2013.01)

(58) Field of Classification Search
USPC .............................................. 367/140
See application file for complete search history.

(56) References Cited

U.S. PATENT DOCUMENTS

| | | | |
|---|---|---|---|
| 7,972,884 B2 | 7/2011 | Obata et al. | |
| 2003/0048154 A1* | 3/2003 | Satoh | H04B 1/48 333/133 |
| 2006/0131998 A1 | 6/2006 | Aoki et al. | |
| 2006/0158062 A1* | 7/2006 | Aoki | H03H 3/08 310/313 B |
| 2007/0278897 A1* | 12/2007 | Ozaki | H03H 3/08 310/313 D |
| 2010/0043189 A1* | 2/2010 | Fukano | H03H 9/059 29/25.35 |
| 2010/0225202 A1* | 9/2010 | Fukano | H03H 9/059 310/313 C |
| 2010/0277037 A1* | 11/2010 | Fukano | H03H 9/059 310/313 C |

(Continued)

FOREIGN PATENT DOCUMENTS

| | | |
|---|---|---|
| JP | 2007-324162 A | 12/2007 |
| JP | 2011-77938 A | 4/2011 |
| KR | 10-2006-0069312 A | 6/2006 |

*Primary Examiner* — James R Hulka
(74) *Attorney, Agent, or Firm* — NSIP Law

(57) ABSTRACT

An acoustic wave device includes an acoustic wave generator spaced apart from a support layer and disposed on a substrate; a protective member coupled to the support layer and spaced apart from the acoustic wave generator by a predetermined distance; and a sealing component sealing the protective member.

17 Claims, 15 Drawing Sheets

(56) References Cited

U.S. PATENT DOCUMENTS

| | | | |
|---|---|---|---|
| 2012/0248933 A1* | 10/2012 | Tsuda | H03H 3/10 310/313 B |
| 2014/0210684 A1* | 7/2014 | Hara | H03H 9/0566 343/858 |
| 2015/0236665 A1* | 8/2015 | Fukano | H03H 3/08 29/25.35 |

* cited by examiner

ACOUSTIC WAVE DEVICE AND METHOD OF MANUFACTURING THE SAME

CROSS-REFERENCE TO RELATED APPLICATION

This application claims benefit of priority under 35 USC 119(a) to Korean Patent Application Nos. 10-2015-0119752, filed on Aug. 25, 2015, and 10-2016-0031386 filed on Mar. 16, 2016, with the Korean Intellectual Property Office, the disclosure of which is incorporated herein by reference in its entirety.

BACKGROUND

1. Field

The present disclosure relates to an acoustic wave device and a method of manufacturing the same.

2. Description of Related Art

A band pass filter is a core component of communications devices that only allows signals in a certain frequency band among various frequencies to pass therethrough to transmit and receive the selected signals.

Representative examples of the band pass filter include a surface acoustic wave (SAW) filter, a bulk acoustic wave (BAW) filter, and the like.

In an acoustic wave device, a predetermined space is required between an acoustic wave generator and a cap member due to operation characteristics thereof. Therefore, the acoustic wave device is manufactured so that a gap is formed between the acoustic wave generator and the cap member.

However, when the acoustic wave device is mounted on a main board and sealed using an epoxy material, or the like, the cap member of the acoustic wave device may be deformed by injection pressure. That is, the gap between the acoustic wave generator and the cap member may be decreased, or the cap member may contact the acoustic wave generator, due to the injection pressure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect of the present disclosure, an acoustic wave device may include: a substrate having one surface on which an acoustic wave generator is provided; an acoustic wave generator spaced apart from a support layer and disposed on a substrate; a protective member coupled to the support layer and spaced apart from the acoustic wave generator by a predetermined distance; and a sealing component sealing the protective member.

According to another aspect of the present disclosure, a method of manufacturing an acoustic wave device may include: preparing a substrate; forming an acoustic wave generator on one surface of the substrate; forming a support component on one surface of the substrate along a circumference of the acoustic wave generator and adhering a protective member on the support component so that the protective member is spaced apart from the acoustic wave generator by a predetermined distance; and forming a sealing component to seal the protective member and the support component.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
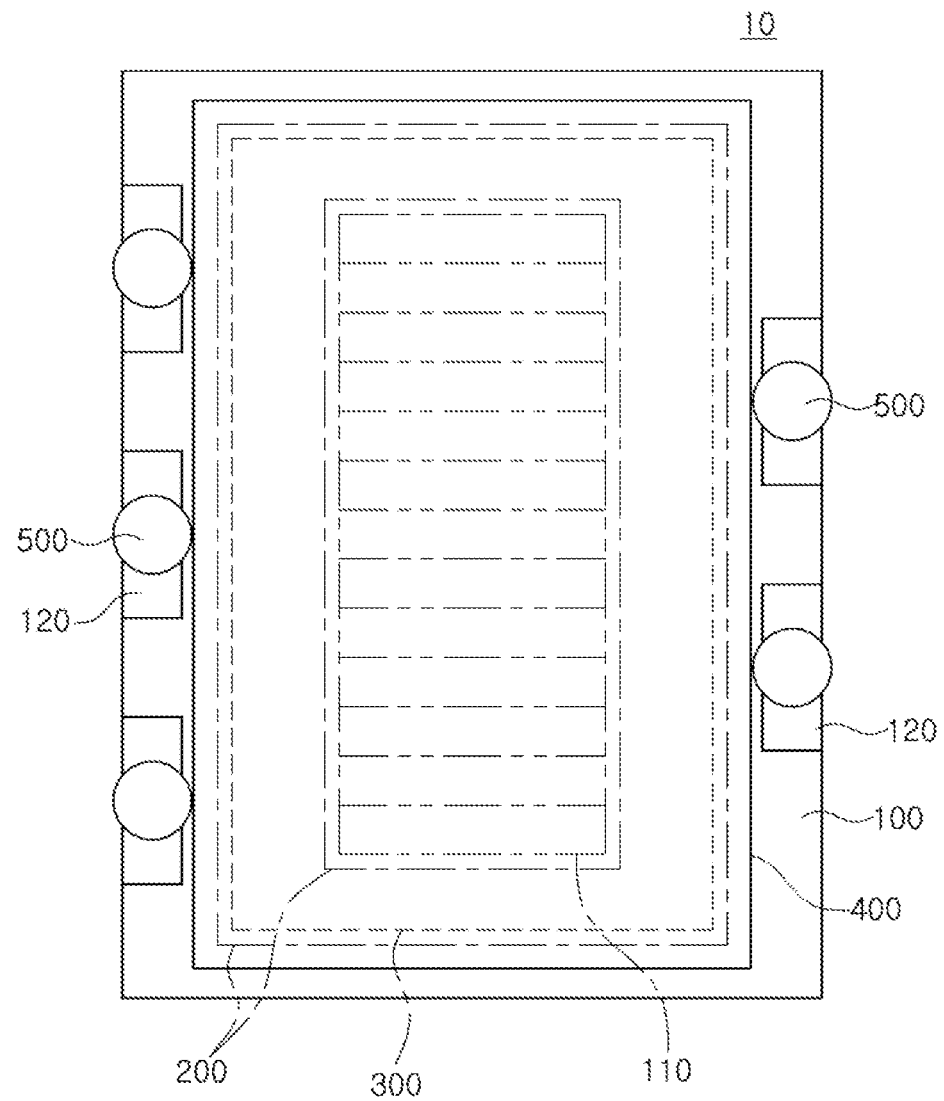
FIG. 1 is a schematic plan view illustrating an acoustic wave device according to an exemplary embodiment in the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for illustrating various embodiments only and is not intended to limit the present description. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present description will be described with reference to schematic views. In the drawings, for example, due to manufacturing techniques and/or tolerances, modifications of the shape shown may be estimated. Thus, embodiments should not be construed as being limited to the particular shapes of regions shown herein, for example, to include a change in shape results in manufacturing. The following embodiments may also be constituted by one or a combination thereof.

According to an example, an acoustic wave device capable of significantly decreasing deformation due to external force such as force applied during an injection-molding process is described. According to another example, a method of manufacturing an acoustic wave device prevented from being deformed is described.

Figure 2:
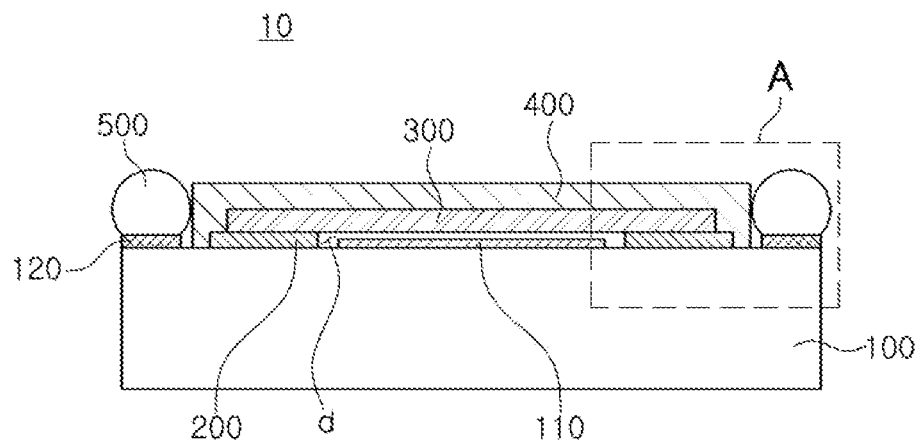
FIG. 2 is a schematic cross-sectional view illustrating the acoustic wave device according to the exemplary embodiment in the present disclosure.
Figure 3:
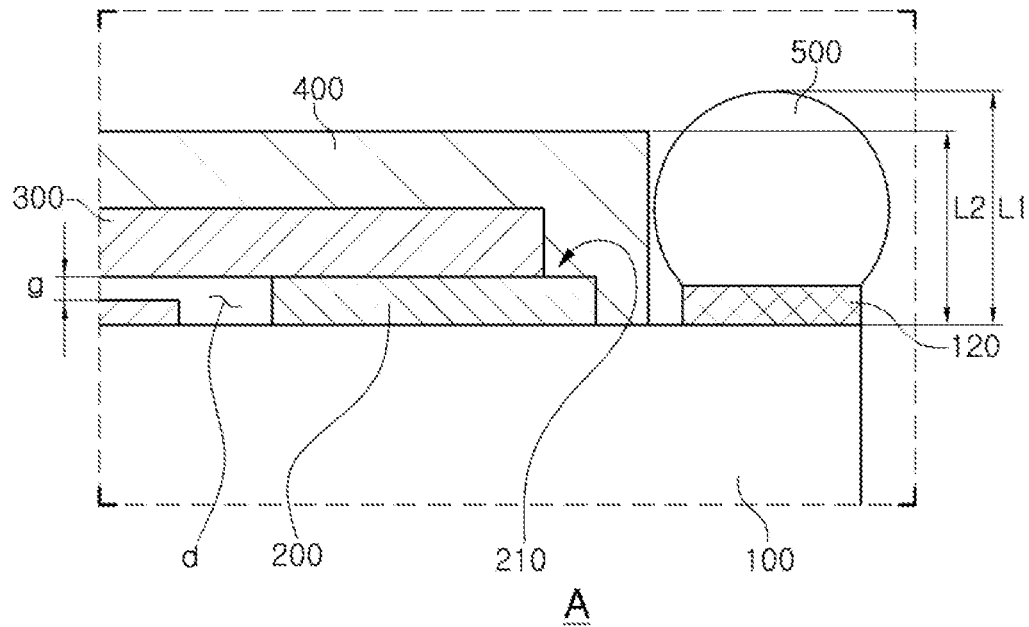
FIG. 3 is an enlarged view of part A of the acoustic wave device illustrated in FIG. 2.

FIG. 1 is a schematic plan view illustrating an acoustic wave device according to an exemplary embodiment in the present disclosure, FIG. 2 is a schematic cross-sectional view illustrating the acoustic wave device according to the exemplary embodiment in the present disclosure, and FIG. 3 is an enlarged view of part A of the acoustic wave device illustrated in FIG. 2.

Referring to FIGS. 1 through 3, the example of an acoustic wave device 10 includes a substrate 100, a support component 200, a protective member 300, and a sealing component 400. In the present exemplary embodiment, the acoustic wave device 10 may include a filter element passing a wave in an approved frequency band such as a surface acoustic wave (SAW) filter, a bulk acoustic wave (BAW) filter, a duplexer, and the like.

In an example in which a SAW filter is used to implement the acoustic wave device 10, a piezoelectric substrate may be used as the substrate 100. In an example in which a BAW filter is used to implement the acoustic wave device 10, a Si substrate may be used as the substrate 100.

For example, the substrate 100 may be formed of a single crystal such as $LiTaO_3$, $LiNbO_3$, $Li_2B_4O_7$, $SiO_2$, silicon, or the like. In addition, a lead zirconate titanate (PZT) based polycrystalline substrate or a ZnO thin film may be used.

However, the substrate used in the acoustic wave device 10 is not limited thereto, but may be replaced with various substrates generally used in the art.

Referring to FIG. 2, an acoustic wave generator 110 may be provided on one surface of the substrate 100.

In an example, the acoustic wave device 10 is provided as a surface acoustic wave (SAW) filter, and the acoustic wave generator 110 is formed of a metal electrode, as illustrated in FIG. 2. The acoustic wave generator 110 may be formed of aluminum (Al) or copper (Cu), and may include an interdigital transducer (IDT) electrode in which a plurality of electrodes alternately cross each other in a comb pattern.

In this case, the acoustic wave generator 110 may be provided by forming a metal layer on the substrate 100 and processing the metal layer in a predetermined electrode form using a photolithography method.

Meanwhile, in another example, the acoustic wave device 10 is provided as a bulk acoustic wave (BAW) filter, and the acoustic wave generator 110 is formed as a separate structure. For example, the acoustic wave generator 110 may include a piezoelectric thin film resonator converting electrical signals into mechanical signals or mechanical signals into electrical signals.

In this case, in the acoustic wave generator 110, a lower electrode, a piezoelectric layer, and an upper electrode may be sequentially formed from a lower portion thereof to thereby form a resonance component as illustrated in FIG. 2.

The support component 200 may be provided on one surface of the substrate 100 to be spaced apart from the acoustic wave generator 110.

The support component 200 may be continuously formed along an edge of the acoustic wave generator 110 to enclose a circumference of the acoustic wave generator 110. For example, the support component 200 may be spaced apart from the acoustic wave generator 110 by a predetermined distance (for example, 3 μm or more) and continuously provided to enclose the circumference of the acoustic wave generator 110.

Further, the support component 200 may protrude from one surface of the substrate 100 with a predetermined protrusion height. In this example, the protrusion height of the support component 200 may be greater than a thickness of the acoustic wave generator 110. Therefore, a gap may be formed between a protective member 300 seated on the support component 200 and the acoustic wave generator 110.

Therefore, a structure of the support component 200 according to the present exemplary embodiment is not limited to the above-mentioned structure, but may be variously changed provided that the gap may be formed between the protective member 300 and the acoustic wave generator 110.

The support component 200 may be formed of an insulating material such as a resin or a polymer. However, a material of the support component 200 is not limited thereto, but in an example in which the support component 200 is sufficiently spaced apart from the acoustic wave generator 110 or the support component 200 and the acoustic wave generator 110 are insulated from each other, the support component 200 may be formed of a metal.

The protective member 300 may be disposed on the support component 200. The acoustic wave generator 110 may be deformed while resonating. Thus, the support component 200 is configured to enable the acoustic wave generator 110 and the protective member 300 to be spaced apart from each other so that the acoustic wave generator 110 does not contact or is separated from the protective member 300 while resonating.

Therefore, in one example, a space portion d formed as an enclosed region between the acoustic wave generator 110, the support component 200, and the protective member 300. In this example, a gap distance g between an upper surface of the acoustic wave generator 110 and a lower surface of the rigidity reinforcement 300 corresponds to a difference in a height of the support component 200 and a thickness of the acoustic wave generator 110. The space portion d is used as a deformation space of the acoustic wave generator 110 at the time of driving the acoustic wave device 10.

The protective member 300 may entirely cover an upper portion of the acoustic wave generator 110.

The protective member 300 according to the present exemplary embodiment may be formed in a flat plate shape, and formed of a metal (for example, a copper plate) in order to provide rigidity. However, a material of the protective member 300 is not limited thereto, but the protective member 300 may be formed of another material such as a resin, or the like, as long as the material may provide the same or similar rigidity as that of a metal structure.

The protective member 300 may contact a portion of an upper surface of the support component 200, and a step portion 210 may be formed between an exterior of the protective member 300 and the support component 200.

In other words, the protective member 300 may be provided only on a portion of the upper surface of the support component 200 in a direction toward the acoustic wave generator 110, such that edges of the protective member 300 and the support component 200 may form the step portion 210 having a step shape.

In a case in which the step portion 210 is formed as described above, an area of contact with a sealing component 400 to be described below may be increased, which may be advantageous in sealing the space portion d to be airtight from an external environment.

The protective member 300 may be separately manufactured and then bonded to the support component 200. In addition, the protective member 300 may be variously modified. For example, the protective member 300 may be directly stacked on the support component 200.

The sealing component 400 may seal exteriors of the protective member 300 and the support component 200.

The sealing component 400 may seal the exteriors of the protective member 300 and the support component 200, thereby preventing moisture and foreign materials from infiltrating into the space portion d between the protective member 300 and the support component 200.

The sealing component 400 may be formed of a thin film layer. For example, the sealing component 400 may be formed of a thin film layer containing at least one ingredient selected from the group consisting of silicon nitride ($Si_xN_y$), silicon dioxide ($SiO_2$), silicon oxy-nitride ($SiO_xN_y$), and silicon carbide (SiC).

However, a material of the sealing component 400 is not limited thereto. If necessary, the sealing component 400 may be formed of a metal such as Au, Ni, Pt, Cu, Al, or the like.

Here, the principle of significantly decreasing deformation of the acoustic wave device 10 according to the exemplary embodiment in the present disclosure will be briefly described.

In general, the acoustic wave device 10 may be mounted on a package board 2 (in FIG. 17), and an encapsulation component 3 embedding the acoustic wave device 10 may be formed by injection-molding in order to protect and seal the acoustic wave device 10. In the event that a resin material such as an epoxy, or the like, is injected, the resin material may compress the sealing component 400 of the acoustic wave device 10 or a cap. In the event that the sealing component 400 is deformed due to the injection pressure as described above, a contact with the acoustic wave generator 110, or the like, may occur.

However, the acoustic wave device 10 according to the exemplary embodiment may include a separate protective member 300 between the sealing component 400 and the acoustic wave generator 110. Since the protective member 300 may supplement rigidity of the sealing component 400, a phenomenon that the sealing component 400 is deformed inwardly by external force may be significantly decreased by the protective member 300.

Therefore, even if injection molding is performed in order to package the acoustic wave device 10, deformation of the acoustic wave device 10 may be significantly decreased.

Meanwhile, an electrode pad 120 and a wiring pattern (not illustrated) electrically connecting the electrode pad 120 and the acoustic wave generator 110 to each other may be provided on one surface of the substrate 100. Further, the electrode pad 120 may be disposed outside of the sealing component 400.

A connection terminal 500 electrically connected to the acoustic wave generator 110 may be disposed on one surface of the substrate 100. The connection terminal 500 may be provided outside the sealing component 400, and bonded to the substrate 100 via the electrode pad 120.

The connection terminal 500 may be formed as a solder ball, a solder bump, or other shapes, but is not limited thereto.

The connection terminal 500 as described above may be provided to establish an electrical connection between the package board 2 (in FIG. 17) and the acoustic wave device 10. For example, the acoustic wave device 10 may be mounted on the package board 2 by soldering the connection terminal 500 and the package board 2.

Referring to the example illustrated in FIG. 3, in order to easily couple the acoustic wave device 10 and the package board 2 to each other, a vertical length L1 from one surface of the substrate 100 to an upper portion of the connection terminal 500 is set to be longer than a vertical length L2 from one surface of the substrate 100 to the sealing component 400.

Figure 4:
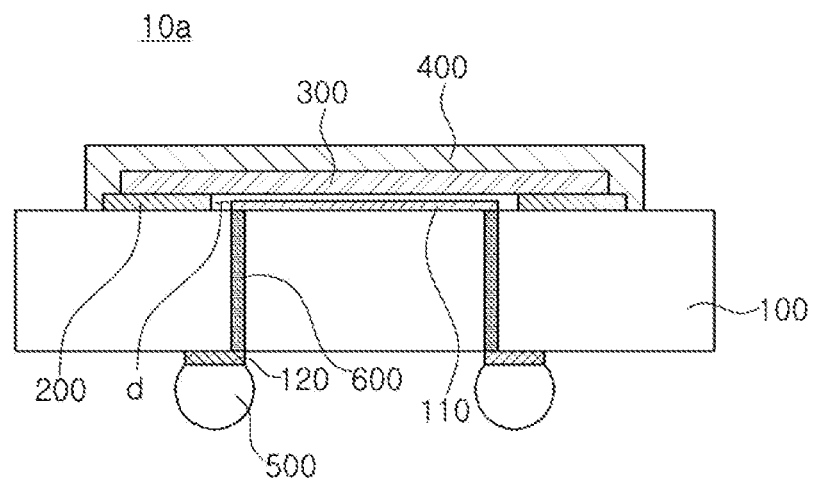
FIG. 4 is a schematic cross-sectional view illustrating an acoustic wave device according to another exemplary embodiment in the present disclosure.

FIG. 4 is a schematic cross-sectional view illustrating an acoustic wave device according to another exemplary embodiment in the present disclosure. Hereinafter, an acoustic wave device 10a according to another exemplary embodiment in the present disclosure will be described with reference to FIG. 4.

Referring to FIG. 4, the acoustic wave device 10a according to another exemplary embodiment may include a substrate 100 having one surface on which an acoustic wave generator 110 is provided, a support component 200 provided on one surface of the substrate 100 to be spaced apart from the acoustic wave generator 110, a protective member 300 coupled on the support component 200 and provided to be spaced apart from the acoustic wave generator 110 by a predetermined distance, a sealing component 400 sealing exteriors of the protective member 300 and the support component 200, and a connection terminal 500 provided on the other surface of the substrate 100 opposing one surface thereof.

Here, other configurations of the acoustic wave device 10a according to the present exemplary embodiment are substantially the same as those of the acoustic wave device illustrated in FIGS. 1 through 3 except for disposition of the connection terminal 500.

Therefore, a detailed description of the same configurations will be omitted and replaced with the above-mentioned description.

In the acoustic wave device 10a according to the present exemplary embodiment, the connection terminal 500 may be provided on the other surface of the substrate 100 opposing one surface thereof on which the acoustic wave generator 110 is provided, and the connection terminal 500 may be electrically connected to the acoustic wave generator 110 through a conductive via 600.

For example, an electrode pad 120 may be provided on the other surface of the substrate 100, and the connection terminal 500 may be coupled to the electrode pad 120.

In this example, because the electrode pad 120 may be electrically connected to the acoustic wave generator 110 by the conductive via 600 penetrating through the substrate 100, the connection terminal 500 and the acoustic wave generator 110 may be electrically connected to each other.

The conductive via 600 may be provided for electrical connection between the connection terminal 500 and the acoustic wave generator 110, and penetrate through the substrate 100.

The conductive via 600 may be provided by filling a penetrated hole of the substrate 100 with a conductive material or applying the conductive material on an inner surface of the penetrated hole.

For example, the conductive material forming the conductive via 600 may be Cu, Ag, Au, Ni, Pt, Pd, or alloys thereof, but is not limited thereto.

Figure 5:
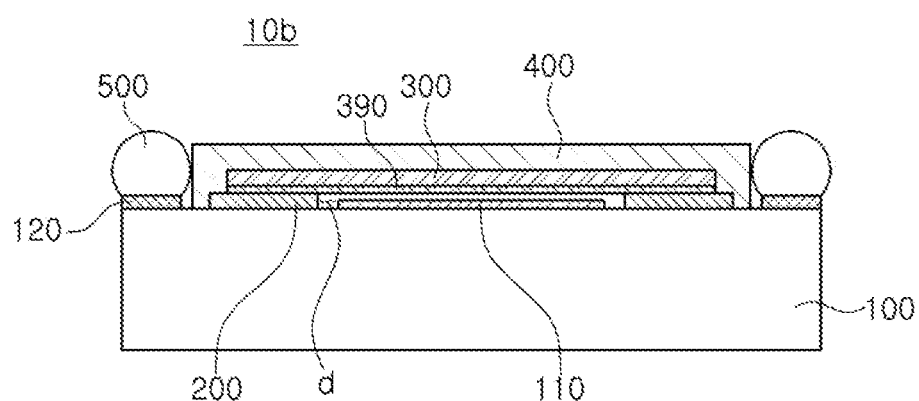
FIG. 5 is a schematic cross-sectional view illustrating an acoustic wave device according to another exemplary embodiment in the present disclosure.

FIG. 5 is a schematic cross-sectional view illustrating an acoustic wave device according to another exemplary embodiment in the present disclosure.

Referring to FIG. 5, an acoustic wave device 10b according to the present exemplary embodiment may include a substrate 100, a support component 200, a protective member 300, and a sealing component 400, wherein an airtight layer 390 may be provided on one surface of the protective member 300.

Other configurations of the acoustic wave device 10b according to the present exemplary embodiment are similar to those of the acoustic wave device illustrated in FIGS. 1 through 3 except for the airtight layer 390. Therefore, a detailed description of the same configurations will be omitted.

In the acoustic wave device 10b according to the present exemplary embodiment, the airtight layer 390 may be disposed on a bottom surface of the protective member 300, that is, one surface of the protective member 300 facing the acoustic wave generator 110.

When the protective member 300 is formed of an insulating material or a resin material rather than a metal, moisture may easily infiltrate as compared to the metal. Therefore, when the protective member 300 is formed of the resin material as in the present exemplary embodiment, moisture may penetrate through the protective member 300 to be introduced toward the acoustic wave generator 110.

Therefore, according to the present exemplary embodiment, in order to prevent as much moisture as possible from infiltrating into the acoustic wave generator 110, the airtight layer 390 may be formed on one surface of the protective member 300. Therefore, moisture resistance performance of the acoustic wave device 10 may be improved through the airtight layer 390.

Meanwhile, in a case in which the infiltration of moisture may be sufficiently prevented with only the protective member 300, S6 and the airtight layer 390 may be omitted.

The airtight layer 390 may be formed of a thin film layer. For example, the airtight layer 390 may be formed of a thin film layer containing at least one ingredient selected from the group consisting of silicon nitride ($Si_xN_y$), silicon dioxide ($SiO_2$), silicon oxy-nitride ($SiO_xN_y$), and silicon carbide (SiC), or a thin insulating layer such as an oxide film.

The airtight layer 390 may be formed using a vapor deposition method. For example, the sealing layer 390 may be formed through a physical vapor deposition (PVD) method or a chemical vapor deposition (CVD) method.

However, a method of forming the sealing layer 390 is not limited thereto. If necessary, the sealing layer 390 may also be formed by a plating method, a painting method, or the like.

Figure 6:
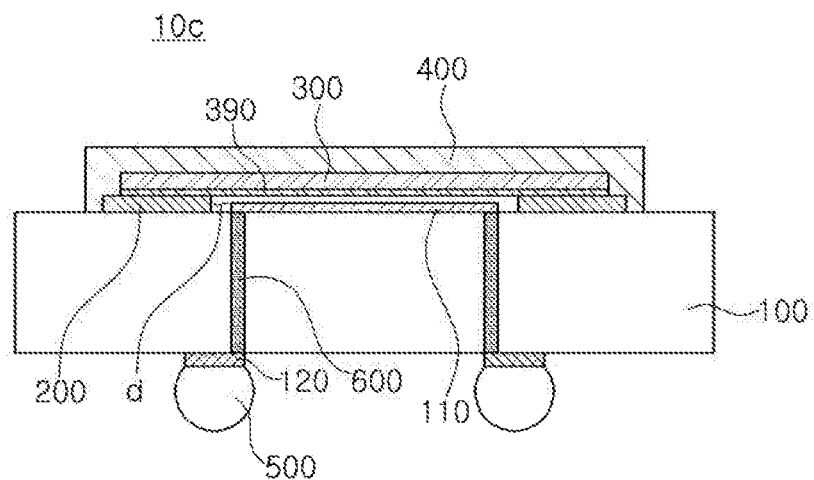
FIG. 6 is a schematic cross-sectional view illustrating an acoustic wave device according to another exemplary embodiment in the present disclosure.

FIG. 6 is a schematic cross-sectional view illustrating an acoustic wave device according to another exemplary embodiment in the present disclosure.

Referring to FIG. 6, an acoustic wave device 10c may include a substrate 100, a support component 200, a protective member 300, a sealing component 400, and a connection terminal 500 electrically connected to an acoustic wave generator 110 disposed on one surface of the substrate 100. In addition, if necessary, an airtight layer 390 may be disposed on a bottom surface of the protective member 300.

In the acoustic wave device 10c according to the present exemplary embodiment, an electrode pad 120 may be provided on the other surface of the substrate 100 opposing one surface thereof, and the connection terminal 500 may be coupled to the electrode pad 120.

The electrode pad 120 and the connection terminal 500 may be electrically connected to the acoustic wave generator 110, through a conductive via 600 penetrating through the substrate 100.

Figure 7:
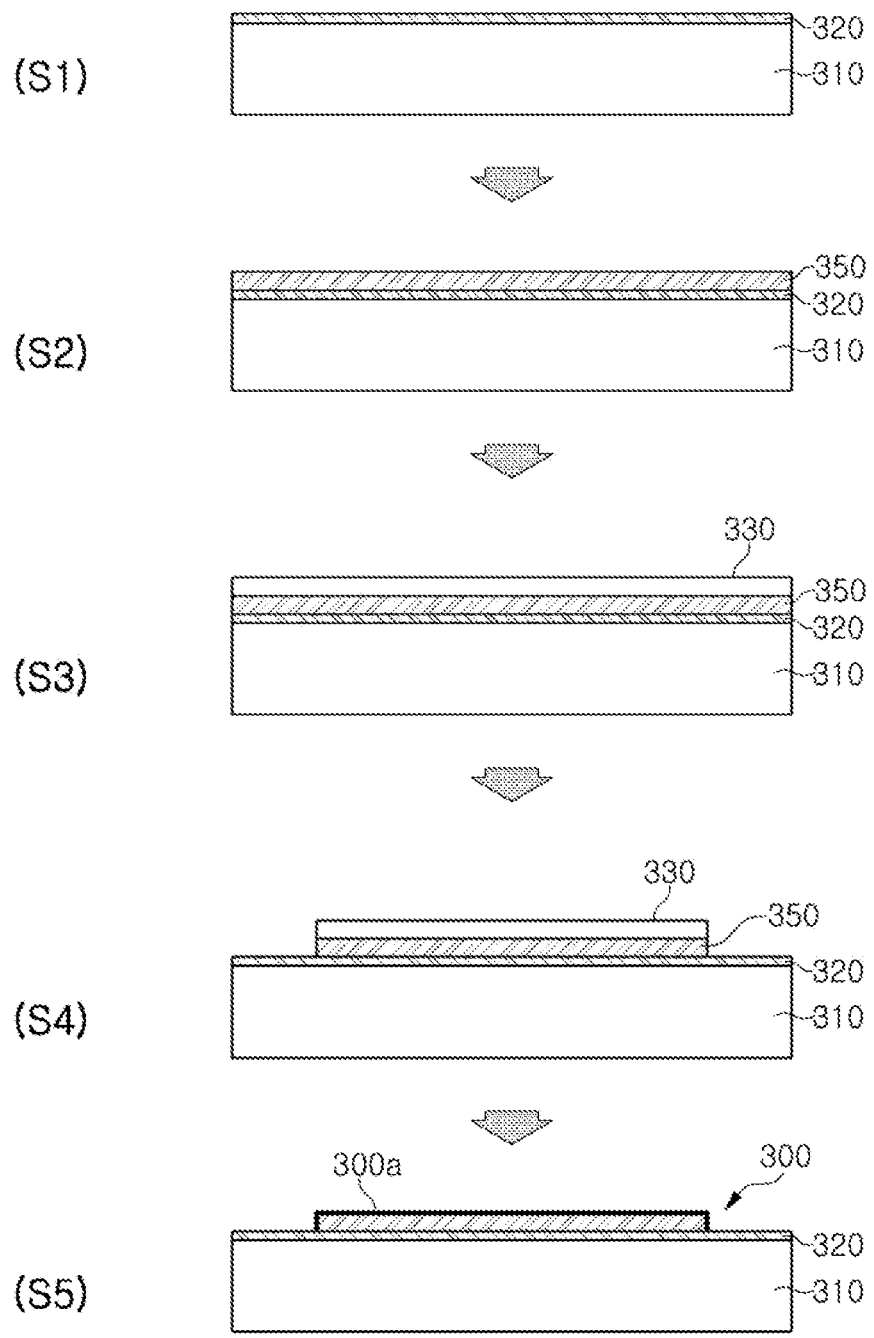
FIGS. 7 and 8 are views illustrating a method of manufacturing the acoustic wave device illustrated in FIG. 2.
Figure 8:
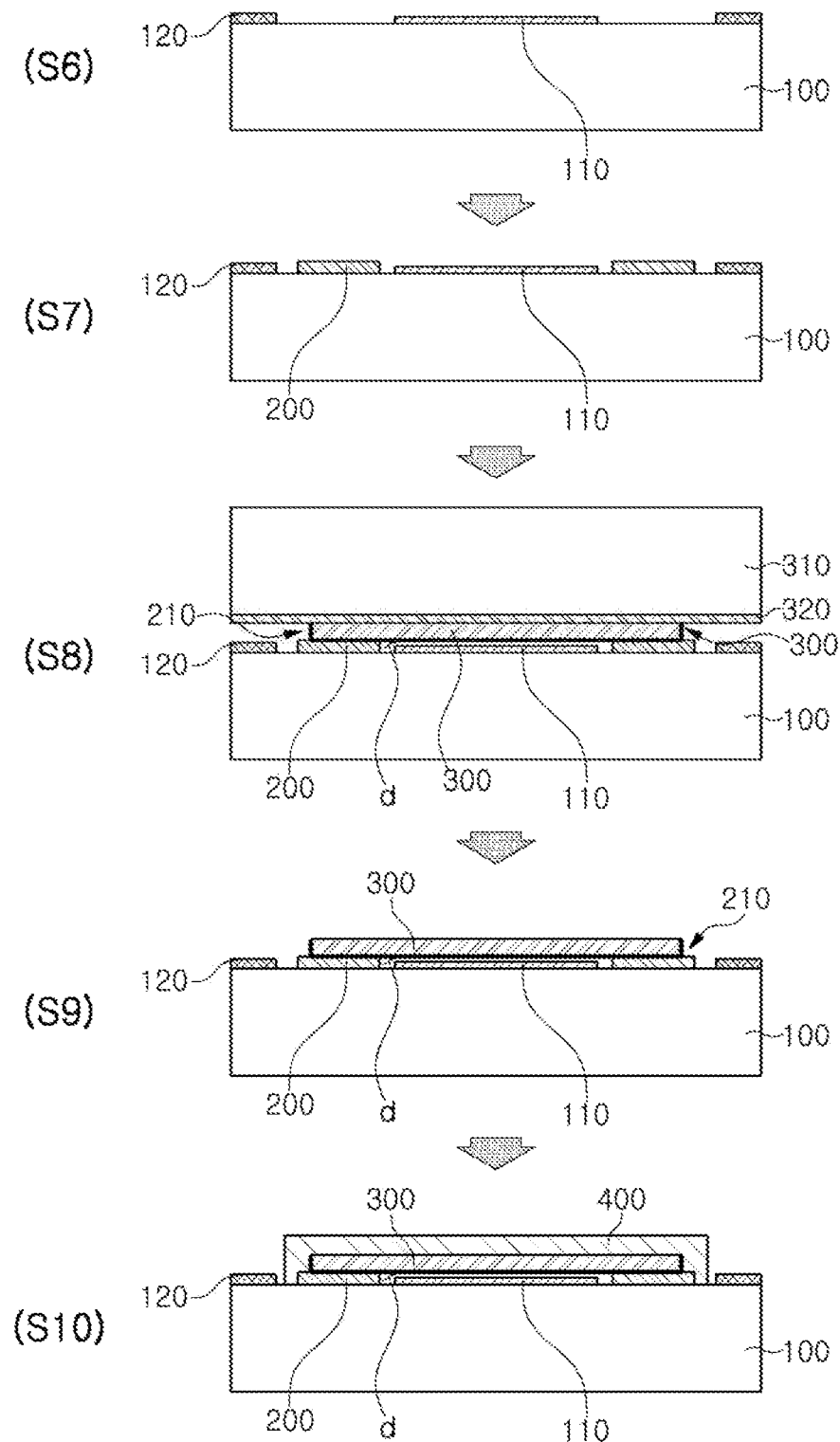

FIGS. 7 and 8 are views illustrating a method of manufacturing an acoustic wave device illustrated in FIG. 2. The method of manufacturing an acoustic wave device 10 according to an exemplary embodiment in the present disclosure will be described with reference to FIGS. 7 and 8.

In the method of manufacturing an acoustic wave device according to the present exemplary embodiment, the protective member 300 (in FIG. 2) and the acoustic wave generator 110 (in FIG. 2) may be manufactured separately from each other and then coupled to each other.

First, a manufacturing method of the protective member 300 will be described.

An adhesive layer 320 may be formed on one surface of a base substrate 310 (S1).

As the base substrate 310, a wafer may be used. In addition, the adhesive layer 320 may be formed of an adhesive tape. For example, as the adhesive layer 320 according to the present exemplary embodiment, a thermally releasable double-sided adhesive tape may be used.

Next, a metal layer 350 may be formed on the adhesive layer 320 (S2).

The metal layer 350 may be formed of a copper (Cu) material on an entire upper surface of the adhesive layer 320. However, a material of the metal layer 350 is not limited thereto, and any metal may be used as long as it may provide a degree of rigidity similar to or stronger than that of copper.

Then, sequentially, a mask layer 330 may be formed on the metal layer 350 (S3) and the metal layer 350 may be patterned using the mask layer 330 (S4).

Here, the mask layer 330 may be formed using a dry film photoresist (DFR), but is not limited thereto.

Then, after the mask layer 330 is removed, an insulating layer 300a may be formed on a surface of the metal layer 350 (S5), thereby completing the protective member 300. Therefore, the entire protective member 300 or the surface of the protective member 300 may be formed of an insulating material. The insulating layer 300a may be formed of an oxide film, but is not limited thereto.

The insulating layer 300a may be provided in order to prevent electrical interferences between the protective member 300, which is formed of a metal, and the acoustic wave generator 110, a wiring of the substrate 100, or the like. Therefore, if insulation between the protective member 300 and the acoustic wave generator 110 or the wiring of the substrate 100 is secured, the forming of the insulating layer 300a on the surface of the protective member 300 may be omitted.

Next, the acoustic wave generator 110 may be formed on the substrate 100 used in the acoustic wave device (S6).

As described above, in a case of the SAW filter, a piezoelectric substrate may be provided as the substrate 100, and in a case of the BAW filter, a Si substrate may be used as the substrate 100.

However, the substrate 100 used in the acoustic wave device is not limited thereto, but may be replaced with various substrates generally used in the art.

As described above, when the acoustic wave device 10 is used as the SAW filter, the acoustic wave generator 110 may be formed of aluminum (Al) or copper (Cu), and have a structure in which a plurality of electrodes alternately cross each other in a comb pattern. In this case, the acoustic wave generator 110 may be provided by forming a conductor layer on the substrate 100 and processing the conductor layer in a predetermined electrode form using a photolithography method.

In addition, when the acoustic wave device 10 is used as the BAW filter, the acoustic wave generator 110 may be provided on one surface of the substrate 100 as a separate structure in which a lower electrode, a piezoelectric layer, and an upper electrode are sequentially stacked.

In S6, an electrode pad 120 electrically connected to the acoustic wave generator 110 may be formed around the acoustic wave generator 110. The electrode pad 120 may be formed together with the acoustic wave generator 110 or formed after the acoustic wave generator 110 is formed. A method of forming the electrode pad 120 on the substrate 100 will be described in more detail in an exemplary embodiment to be described below.

After the acoustic wave generator 110 is formed on the substrate 100, a support component 200 may be formed on one surface of the substrate 100 along a circumference of the acoustic wave generator 110 (S7).

The support component 200 may be formed of an insulating material such as a resin or a polymer. However, if necessary, the support component 200 may be formed of a metal.

The support component 200 may be formed using a photolithography method. However, the support component 200 is not limited thereto.

Then, the protective member 300 manufactured in S5 may be transferred to the support component 200 manufactured in S5 (S8). At this time, the protective member 300 may be seated on the support component 200 while being spaced apart from the acoustic wave generator 110 by a predetermined distance.

The protective member 300 may be disposed to entirely cover an upper portion of the acoustic wave generator 110. Therefore, the acoustic wave generator 110 may be disposed in a space portion d formed by the protective member 300 and the support component 200.

Here, the protective member 300 may contact a portion of an upper surface of the support component 200, and a step portion 210 may be formed between an exterior of the protective member 300 and the support component 200.

In S8, the protective member 300 may be adhered to the support component 200 in a state in which the protective member 300 is adhered to the base substrate 310. Therefore, even though a thickness of the protective member 300 is thin, the protective member may be easily handled.

When the protective member 300 is transferred to the support component 200, the base substrate 310 attached to the protective member 300 via the adhesive layer 320 may be removed (S9). As described above, as the adhesive layer 320, a thermally releasable adhesive tape may be used. Therefore, the base substrate 310 may be easily separated from the protective member 300 by applying heat to the adhesive layer 320. Meanwhile, in a case in which the adhesive layer 320 is formed of a UV tape, the base substrate 310 may be separated from the protective member 300 by irradiating UV lights to the adhesive layer 320.

Next, a sealing component 400 sealing the protective member 300 and the support component 200 may be formed (S10).

The forming of the sealing component 400 may include entirely forming a sealing layer on one surface of the substrate 100 on which the protective member 300 is disposed; and partially removing the sealing layer using a photolithography method to expose the electrode pad 120 externally.

Here, the sealing component 400 may be formed through a vapor deposition method. For example, the sealing component 400 may be formed through a physical vapor deposition (PVD) method or a chemical vapor deposition (CVD) method.

In more detail, the sealing component 400 may be formed using any one method among a sputtering method, an E-beam evaporation method, a thermal evaporation method, a laser molecular beam epitaxy (L-MBE) method, a pulsed laser deposition (PLD) method, a metal-organic chemical vapor deposition (MOCVD) method, a hydride vapor phase epitaxy (HVPE) method, and a plasma enhanced chemical vapor deposition (PECVD) method.

Thereafter, the acoustic wave device 10 illustrated in FIG. 2 may be completed by forming a connection terminal 500 on one surface of the substrate 100.

The connection terminal 500 may be formed on the electrode pad 120 formed on one surface of the substrate 100. However, a position on which the connection terminal 500 is provided is not limited to one surface of the substrate 100 on which the acoustic wave generator 110 is provided. In another example, the connection terminal 500 may be provided on the other surface of the substrate 100 opposing the surface thereof on which the acoustic wave generator 110 is provided as illustrated in FIG. 4. In this case, a conductive via 600 (in FIG. 4) electrically connecting the acoustic wave generator 110 and the connection terminal 500 may be further formed.

Meanwhile, the method of manufacturing an acoustic wave device according to the present exemplary embodiment is not limited thereto, but may be variously modified.

Figure 9A:
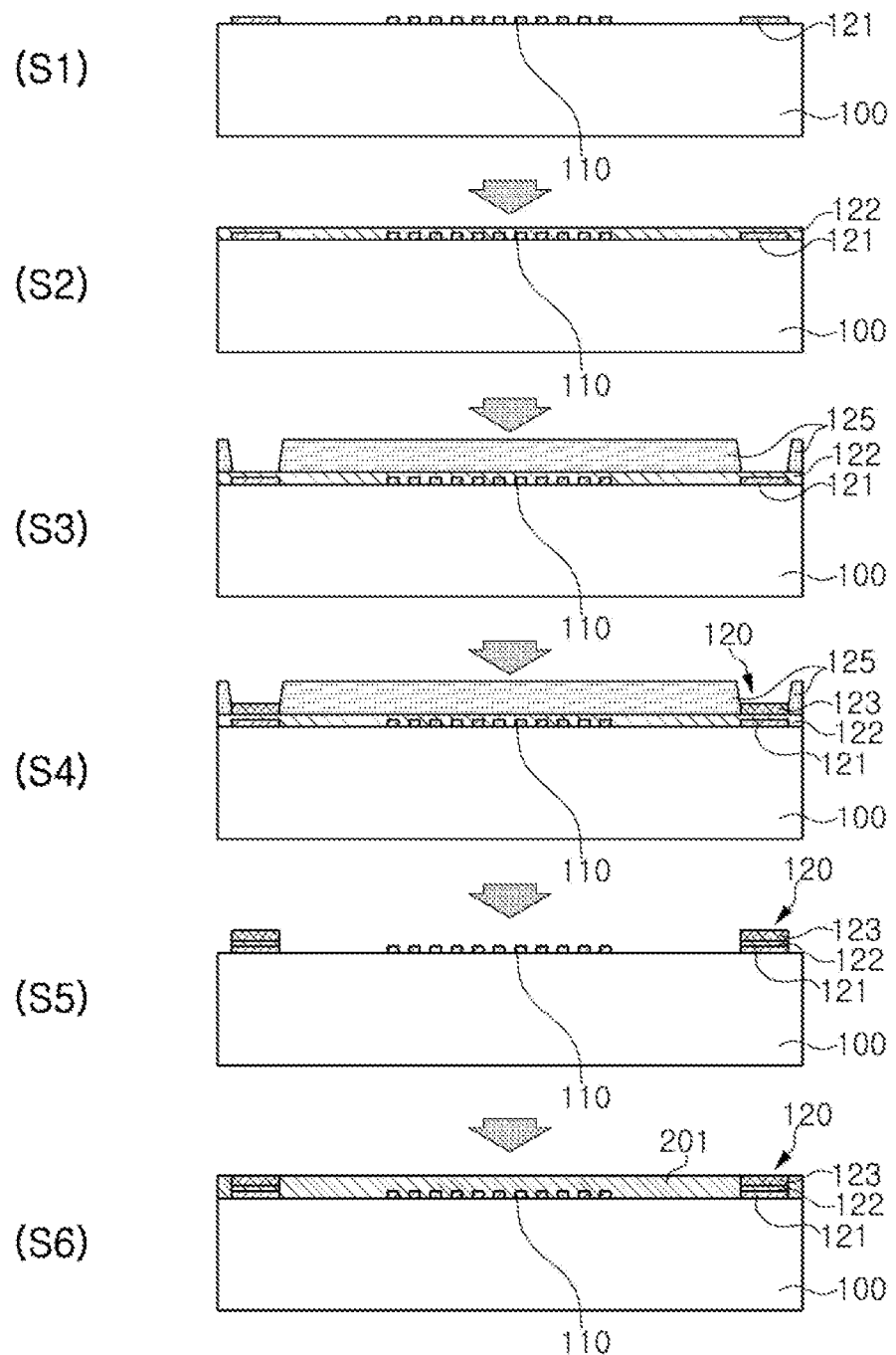
FIGS. 9A and 9B are views illustrating a method of manufacturing an acoustic wave device according to another exemplary embodiment in the present disclosure.
Figure 9B:
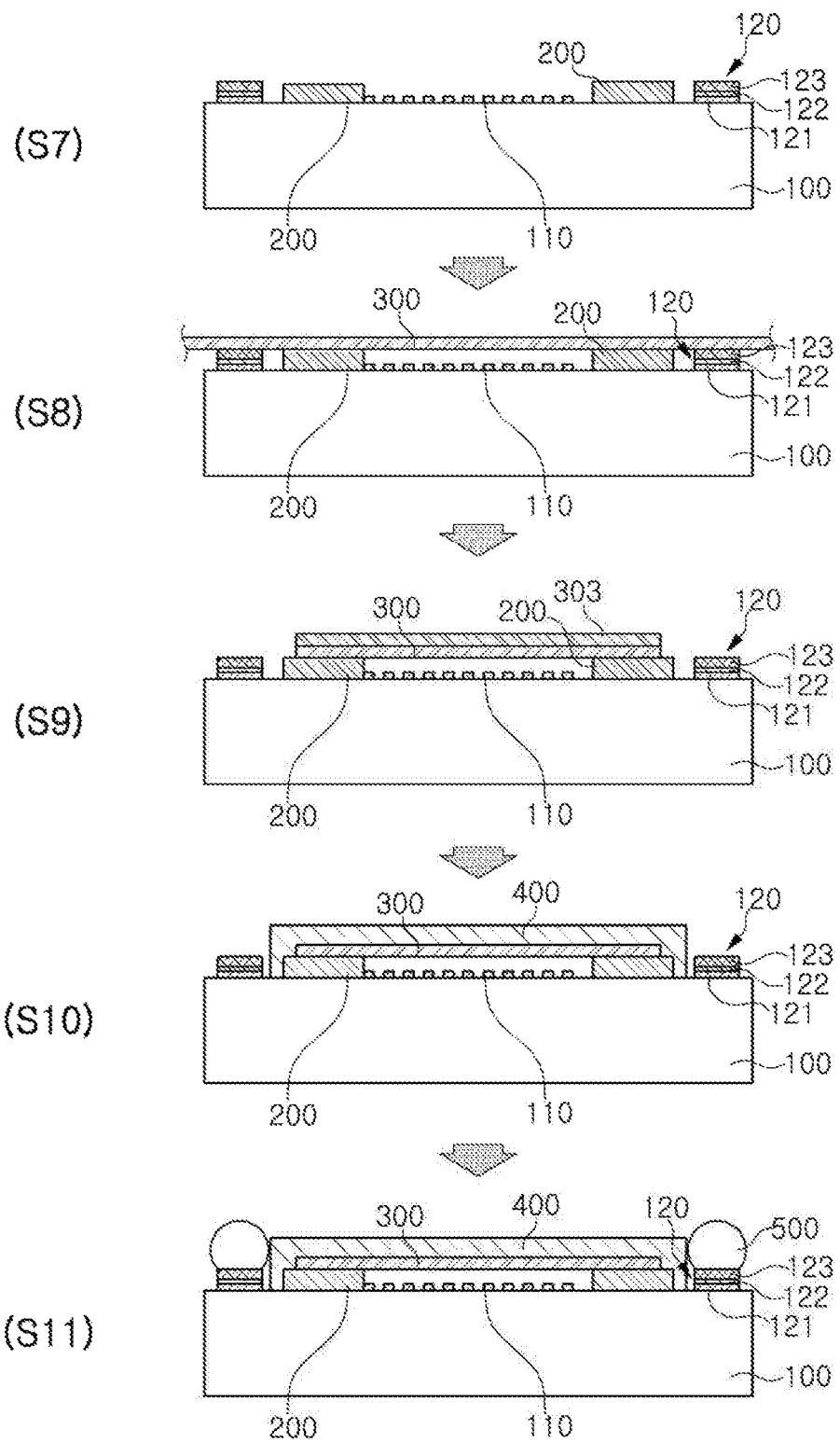

FIGS. 9A and 9B are views illustrating a method of manufacturing an acoustic wave device according to another exemplary embodiment in the present disclosure.

Referring to FIGS. 9A and 9B, in the method of manufacturing an acoustic wave device according to the present exemplary embodiment, first, an acoustic wave generator 110 may be formed on a substrate 100 (S1).

The acoustic wave generator 110 may be provided by forming a conductor layer on the substrate 100 and processing the conductor layer in a predetermined electrode form using a photolithography method.

In a case in which the acoustic wave device is a SAW filter, the conductive layer may be formed of aluminum (Al). However, the conductor layer is not limited thereto.

A wiring pattern (not illustrated) electrically connected to the acoustic wave generator 110 may be formed together with the acoustic wave generator 110 around the acoustic wave generator 110. In addition, the wiring pattern may include a plurality of wiring layers 121 to be formed as an electrode pad 120 later.

An insulating protective film (not illustrated) such as a $SiO_2$ film may be formed on surfaces of the acoustic wave generator 110 and the wiring pattern. However, the wiring layer 121 of the wiring pattern may be exposed externally of the insulating protective film.

Meanwhile, a case of manufacturing a SAW filter in which the acoustic wave generator 110 is formed in a metal electrode form is described by way of example in the present exemplary embodiment, the acoustic wave generator 110 is not limited thereto. For example, the acoustic wave generator 110 may be formed in a piezoelectric thin film resonator form, such that the acoustic wave device may be manufactured as a BAW filter.

Then, a seed layer 122 may be formed on the acoustic wave generator 110 and the wiring layer 121 (S2). The seed layer 122 may be provided in order to perform electroplating, and formed of a copper (Cu) material by a sputtering method. However, a method of forming the seed layer 122 is not limited thereto.

An insulating film may be formed on the acoustic wave generator 110. Therefore, the seed layer 122 may be directly bonded only to the wiring layer 121 exposed externally of the insulating film.

Next, after a mask layer 125 is formed on the seed layer 122, the mask layer 125 may be removed so that a portion of the seed layer 122 is exposed (S3). Here, regions of the seed layer 122 corresponding to the wiring layer 121 may be exposed.

Then, a shape of the electrode pad 120 may be formed by forming a plating layer 123 on the exposed seed layer 122 (S4). The plating layer 123 may be formed using the seed layer 122 by an electroplating method. However, the plating method is not limited thereto, but if necessary, an electroless plating method may also be used.

The plating layer 123 according to the present exemplary embodiment may be formed by sequentially stacking a nickel (Ni) layer and a gold (Au) layer on the seed layer 122. However, a method of forming the plating layer 123 is not limited thereto.

Next, the mask layer 125 and the seed layer 122 may be removed (S5). Regions of the seed layer 122 except for a region thereof corresponding to the electrode pad 120 may be removed. Therefore, the electrode pad 120 and the acoustic wave generator 110 may be formed on the substrate 100.

Meanwhile, in a case in which the acoustic wave device according to the present exemplary embodiment is manufactured in a SAW filter structure as in the present exemplary embodiment, the wiring layer 121 may be formed of an aluminum (Al) material. In this example, the wiring layer 121 exposed externally may be removed together during the photolithography or etching to be performed later. Therefore, in order to prevent the exposed wiring layer 121 from being removed, in the acoustic wave device according to the present exemplary embodiment, the plating layer 123 may be formed on the exposed wiring layer 121 as a barrier layer.

However, in an example in which the acoustic wave device is manufactured in a BAW filter structure, since the wiring layer 121 is formed of a molybdenum (Mo) material or a gold (Au) material, which is not easily removed during the etching, the plating layer 123 or the seed layer 122, and the forming of the plating layer 123 and the seed layer 122 may be omitted.

Then, sequentially, a support layer 201 may be formed on one surface of the substrate 100 (S6), and then, a support component 200 may be formed along a circumference of the acoustic wave generator 110 by partially removing the support layer 201 (S7).

The support component 200 may be formed of an insulating material such as a resin or a polymer. However, if necessary, the support component 200 may be formed of a metal.

Further, the support component 200 may be formed using a photolithography method. However, a method of forming the support component 200 is not limited thereto.

Then, a protective member 300 may be stacked on the support component 200 (S8). At this time, the protective member 300 may be seated on the support component 200 while being spaced apart from the acoustic wave generator 110 by a predetermined distance.

The protective member 300 may be formed of a single metal sheet. For example, as the protective member, a copper (Cu) sheet may be used.

Figure 15:
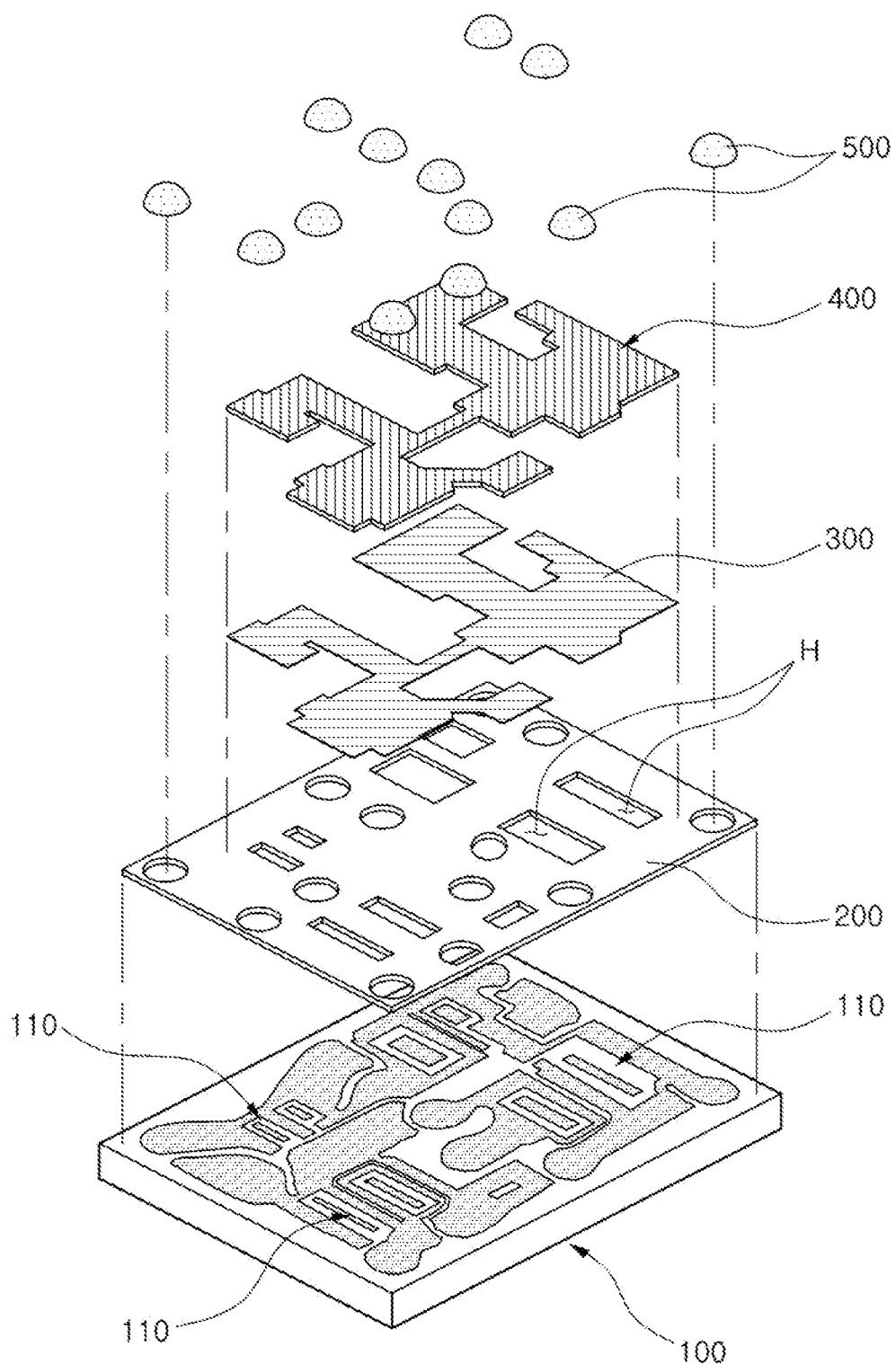
FIG. 15 is an exploded perspective view of the acoustic wave device illustrated in FIG. 14.

In addition, as illustrated in FIG. 15, the protective member 300 according to the present exemplary embodiment may be formed of a metal sheet to have a size and shape sufficient to simultaneously cover a plurality of acoustic wave generators 110. Therefore, since an area of the protective member 300 supported by the support component 200 while contacting the support component 200 is similar to or larger than an area of the space portion d (in FIG. 2), even though the protective member 300 is stacked on the support component 200, a flat sheet shape may be maintained.

Then, a mask layer 303 may be formed on the protective member 300, and the protective member 300 may be patterned (S9). This operation (S9) may be performed through a photolithography method.

Next, a sealing component 400 sealing the protective member 300 and the support component 200 may be formed (S10).

The sealing component 400 may be formed of a thin film layer formed of an insulating material as described above.

However, a material of the sealing component 400 is not limited thereto, but if necessary, the sealing component 400 may be formed of a metal.

Further, the sealing component 400 may be formed through a vapor deposition method as described above. However, a method of forming the sealing component 400 is not limited thereto, but may be variously changed. For example, the sealing component 400 may be formed using a plating method.

Thereafter, a connection terminal 500 may be formed on the electrode pad 120 (S11), thereby completing the acoustic wave device.

Figure 10A:
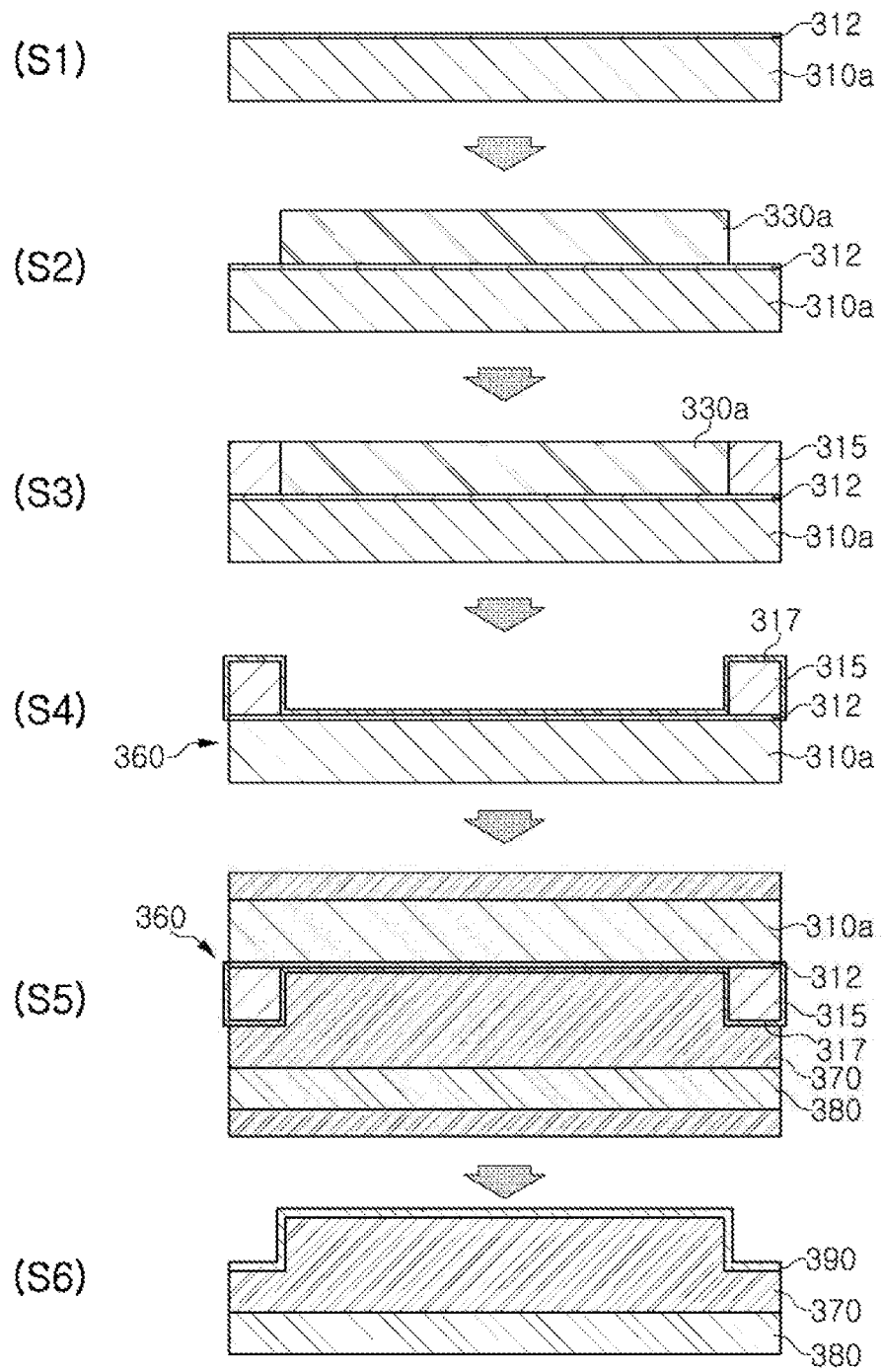
FIGS. 10A through 10C are views illustrating a method of manufacturing an acoustic wave device according to another exemplary embodiment in the present disclosure.
Figure 10B:
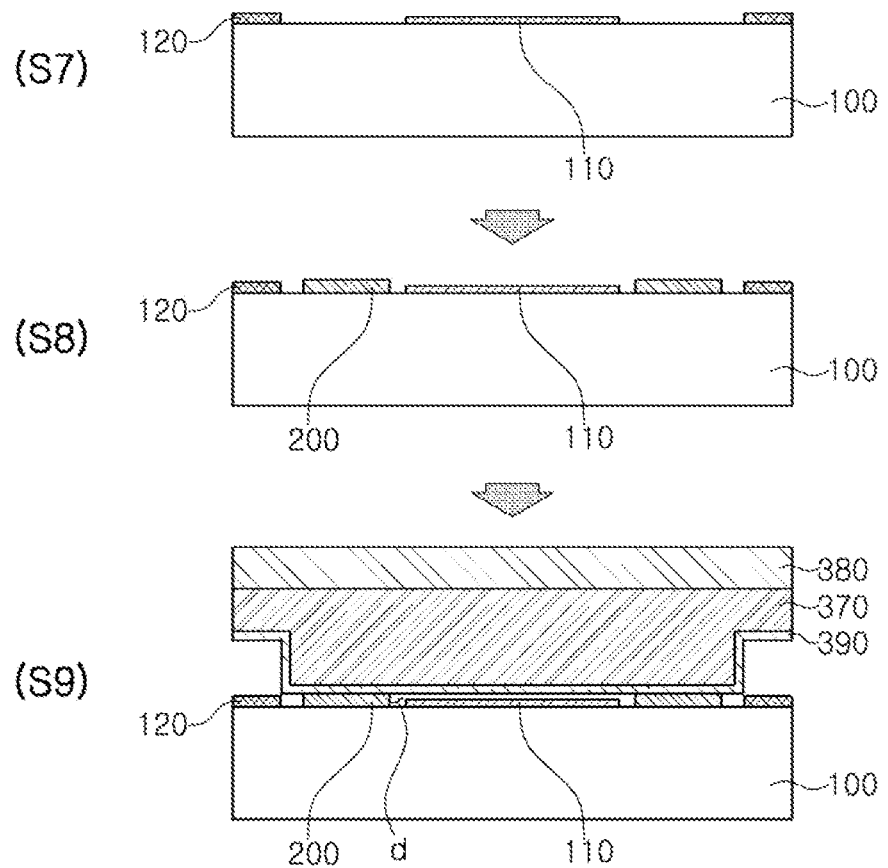
Figure 10C:
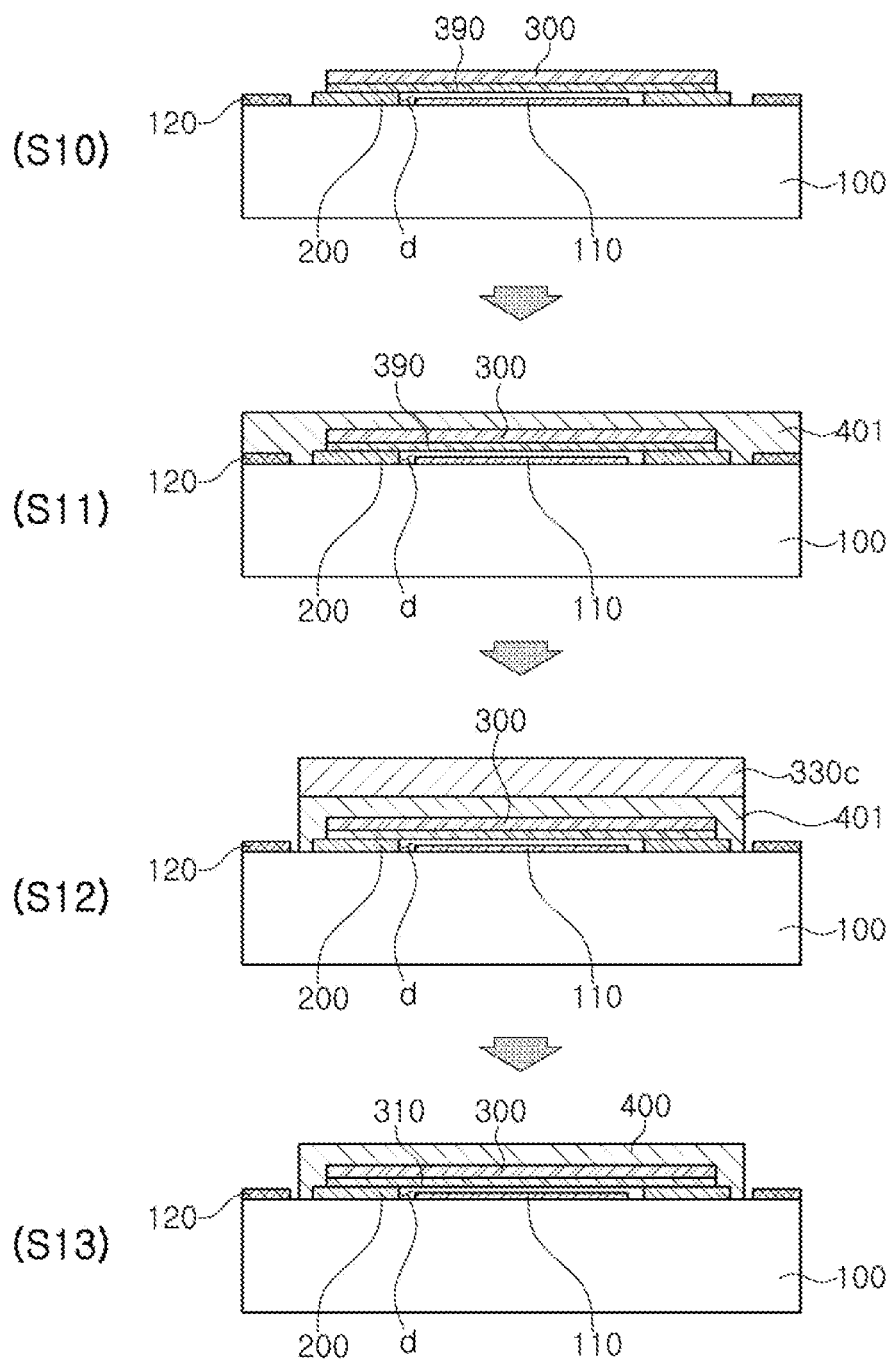

FIGS. 10A through 10C, which are views illustrating a method of manufacturing an acoustic wave device according to another exemplary embodiment in the present disclosure, illustrate a method of manufacturing the acoustic wave device illustrated in FIG. 5.

Here, FIG. 10A illustrates a method of forming a protective member 300, and FIGS. 10B and 10C illustrate a method of coupling the protective member 300 to a substrate to complete the acoustic wave device.

First, the method of forming the protective member 300 will be described with reference to FIG. 10A.

A seed layer 312 may be formed on a base substrate 310a (S1). The seed layer 312 may be formed of titanium (Ti), aluminum (Al), copper (Cu), or the like, and as the base substrate 310a, a wafer may be used, but materials of the seed layer 312 and the base substrate 310a are not limited thereto.

Then, sequentially, a mask layer 330a may be formed on the seed layer 312 (S2) and a plating layer 315 may be formed using the mask layer 330a (S3). The plating layer 315 may be formed of the same material as that of the seed layer 312, but is not limited thereto.

Thereafter, the mask layer 330a may be removed, and a coating layer 317 may be formed on surfaces of the seed layer 312 and the plating layer 315 (S4), thereby completing a frame 360 for forming the protective member 300.

The coating layer 317 may be provided in order to easily separate an insulating member 370 formed of a resin material, to be described below, from the frame 360. The coating layer 317 may be formed of a material containing fluorine, for example, a Teflon material, but is not limited thereto.

Then, the frame 360 may be disposed in a mold (not illustrated) and the insulating member 370 may be formed on the frame 360 by injection molding (S5). Further, a transfer substrate 380 may be disposed outside the insulating member 370 in order to easily handle the insulating member 370.

The insulating member 370 may be formed in accordance with shapes of the seed layer 312 and the plating layer 315. Therefore, a portion of the insulating member 370 corresponding to a portion of the frame 360 on which only the seed layer 312 is formed may be formed to be thick, and a portion thereof corresponding to a portion of the frame 360 on which the plating layer 315 is formed may be formed to be relatively thick.

Although a case in which the number of thick portions of the insulating member 370 is one is illustrated in FIG. 10A, the number of thick portions is not limited thereto. That is, a plurality of thick portions and a plurality of thin portions may be repetitively disposed.

The thick portion of the insulating member 370 may be finally formed as the protective member 300. On the other hand, the thin portion thereof may be finally removed. Therefore, the thin portions of the insulating member 370 may serve as a connection portion connecting the thick portions of the insulating member 370 to each other.

As the transfer substrate 380, a substrate of which adhesion and separation may be easily performed may be used. For example, a thermally releasable film, a UV film, a dummy wafer, or the like, may be used, and a film having flexibility or a substrate having rigidity may be all used.

Next, after an insulating member 370 is separated from the frame 360, an airtight layer 390 may be formed on a surface of the insulating member 370 (S6). As described above, the airtight layer 390 may be formed of a thin film layer containing at least one ingredient selected from the group consisting of silicon nitride ($Si_xN_y$), silicon dioxide ($SiO_2$), silicon oxy-nitride ($SiO_xN_y$), and silicon carbide (SiC) or an oxide film.

Since the insulating member 370 is formed of a resin material, moisture may easily infiltrate therethrough, as compared to a metal. Therefore, when the protective member 300 is formed of the resin material as in the present exemplary embodiment, moisture may penetrate through the protective member 300 to be introduced toward the acoustic wave generator 110.

Therefore, according to the present exemplary embodiment, in order to prevent as much moisture as possible from infiltrating into the acoustic wave generator 110, the airtight layer 390 may be formed on one surface of the protective member 300.

Meanwhile, in a case in which infiltration of moisture may only be sufficiently prevented with the protective member 300, the airtight layer 390 may be omitted.

Next, the method of coupling the protective member 300 to the substrate 100 to complete the acoustic wave device will be described with reference to FIGS. 10B and 10C.

First, the acoustic wave generator 110 may be formed on a substrate 100 used in the acoustic wave device (S7). In this case, after the acoustic wave generator 110 is formed, an electrode pad 120 electrically connected to the acoustic wave generator 110 may be formed on one surface of the substrate 100.

Next, a support component 200 may be formed on the substrate 100 along a circumference of the acoustic wave generator 110 (S8). The support component 200 may be formed of an insulating material such as a resin or a polymer. However, if necessary, the support component 200 may be formed of a metal. Further, the support component 200 may be formed using a photolithography method. However, a method of forming the support component 200 is not limited thereto.

Then, the insulating member 370 may be transferred to the support component 200 (S9). At this time, the insulating member 370 may be seated on the support component 200 while being spaced apart from the acoustic wave generator 110 by a predetermined distance.

Further, the insulating member 370 may be transferred to the support component 200 while the airtight layer 390 formed on one surface of the insulating member 370 contacts an upper surface of the support component 200.

When the insulating member 370 is transferred to the support component 200, the transfer substrate 380 attached to the insulating member 370 may be removed, and unnecessary portions of the insulating member 370 may be removed (S10). For example, the insulating member 370 may be polished so as to be relatively thin, thereby completing the protective member 300 illustrated in FIG. 5.

Meanwhile, although not illustrated, as the insulating member 370 is polished, all of the thin portions of the insulating member 370 may be removed, and the plurality of thick portions thereof may be separated from each other to thereby be formed as protective members 300, respectively. Therefore, a plurality of protective members 300 may be simultaneously disposed on a plurality of acoustic wave generators 110.

Thereafter, sequentially, a sealing layer 401 may be formed on the protective member 300 (S11) in order to form a sealing component 400 in which the protective member 300 is embedded, a mask layer 330c may be formed on the sealing layer 401 and the sealing layer 401 may be partially removed (S12), and then, the sealing component 400 may be completed by removing the mask layer 330c (S13).

Thereafter, the acoustic wave device 10b illustrated in FIG. 5 may be completed by bonding a connection terminal 500 on the electrode pad 120.

Since the sealing component 400 and the connection terminal 500 may be similarly manufactured as in the exemplary embodiment described above, a description thereof will be omitted.

Figure 11:
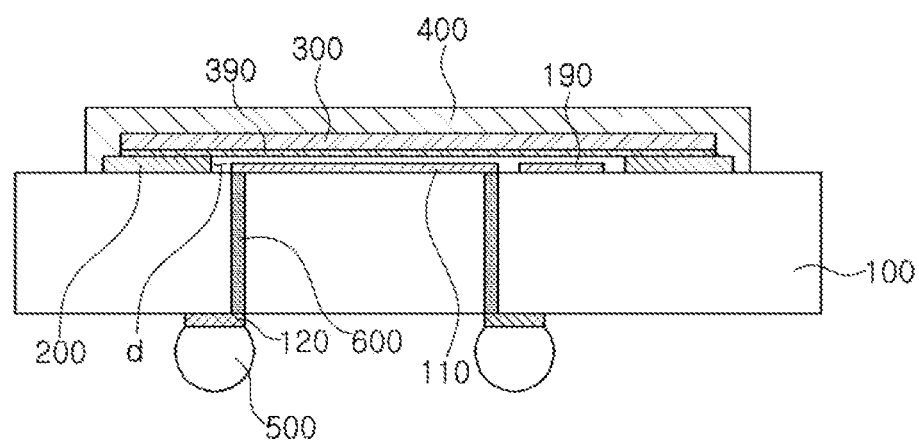
FIGS. 11 through 13 are schematic cross-sectional views illustrating acoustic wave devices according to other exemplary embodiments in the present disclosure, respectively.
Figure 12:
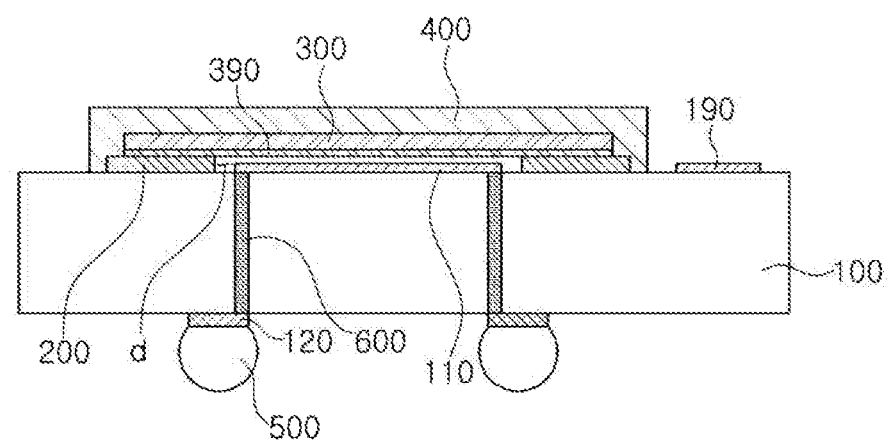
Figure 13:
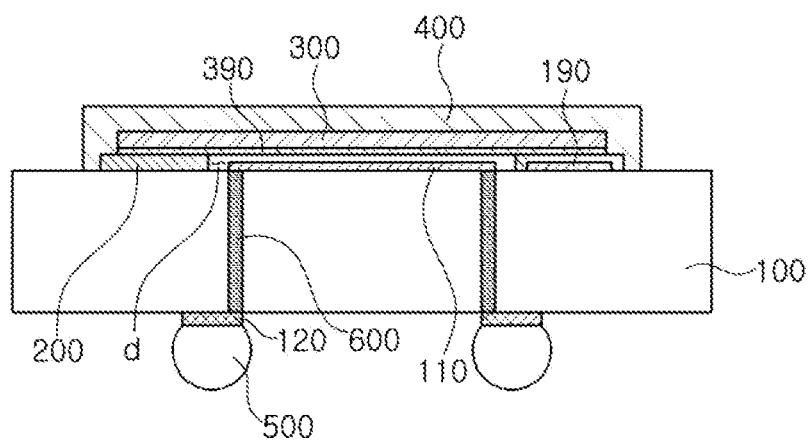

FIGS. 11 through 13 are schematic cross-sectional views illustrating acoustic wave devices according to other exemplary embodiments in the present disclosure, respectively.

First, referring to FIG. 11, the acoustic wave device according to the present exemplary embodiment may be used as a duplexer including an antenna.

To this end, the acoustic wave device according to the present exemplary embodiment may further include at least one antenna 190.

The antenna 190 may be formed as a portion of a wiring pattern, and electrically connected to an acoustic wave generator 110.

The antenna 190 according to the present exemplary embodiment may be disposed to be spaced apart from the acoustic wave generator 110 by a predetermined distance, and disposed in a space portion d together with the acoustic wave generator 110.

However, a configuration of the antenna 190 is not limited thereto. For example, the antenna may also be disposed outside the space portion d rather than inside the space portion d as illustrated in FIG. 12.

Further, as illustrated in FIG. 13, the antenna 190 may also be interposed between a substrate 100 and a support component 200. In this example, the acoustic wave device may be manufactured by forming the antenna 190 on the substrate 100 and then forming the support component 200 thereon.

As described above, the acoustic wave device according to the present disclosure may be variously modified.

Figure 14:
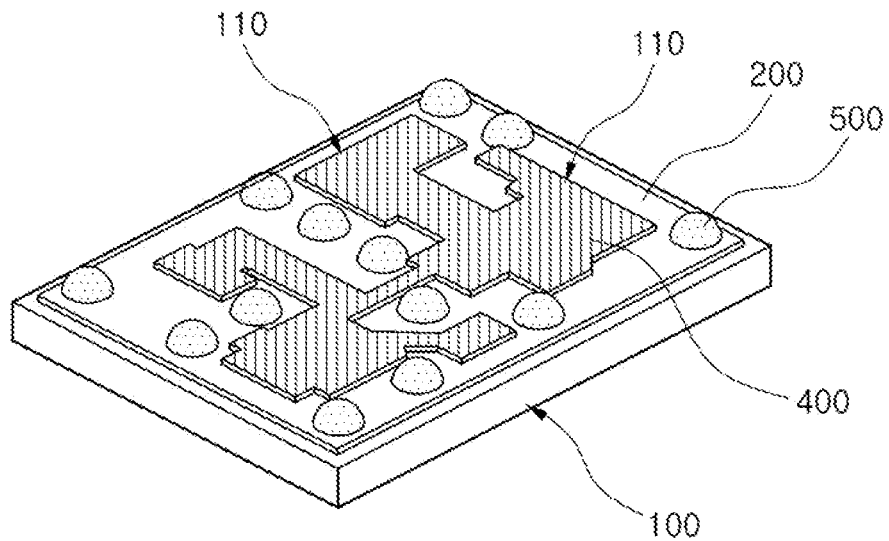
FIG. 14 is a perspective view schematically illustrating an acoustic wave device according to another exemplary embodiment in the present disclosure.

FIG. 14 is a perspective view schematically illustrating an acoustic wave device according to another exemplary embodiment in the present disclosure, and FIG. 15 is an exploded perspective view of the acoustic wave device illustrated in FIG. 14.

Referring to FIGS. 14 and 15, in the acoustic wave device according to the present exemplary embodiment, a plurality of acoustic wave generators 110 may be disposed on a single substrate 100.

A support component 200 may be formed in a single layer sheet form, and include a plurality of holes H in which the acoustic wave generator 110 is disposed.

A protective member 300 may be formed in a single layer sheet form and stacked on the support component 200, and may close the holes H formed in the support component 200.

A sealing component 400 may be disposed on the protective member 300.

The protective member 300 may be formed of a metal plate or a metal sheet, and the sealing component 400 may be formed of an insulating material covering the protective member 300.

In the acoustic wave device according to the present exemplary embodiment as described above, a plurality of space portions d (in FIG. 2) in which the acoustic wave generator 110 is accommodated may be simultaneously formed by stacking a single layer support component 200 and a single layer protective member 300.

Figure 16:
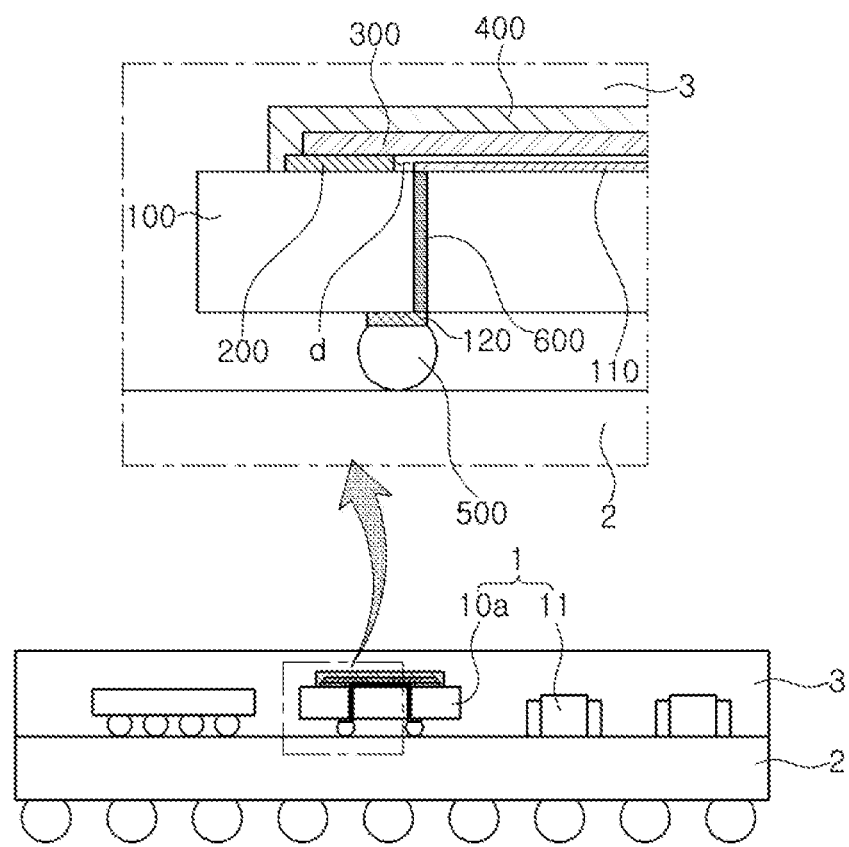
FIGS. 16 and 17 are schematic cross-sectional views illustrating acoustic wave device packages according to other exemplary embodiments in the present disclosure, respectively.
Figure 17:
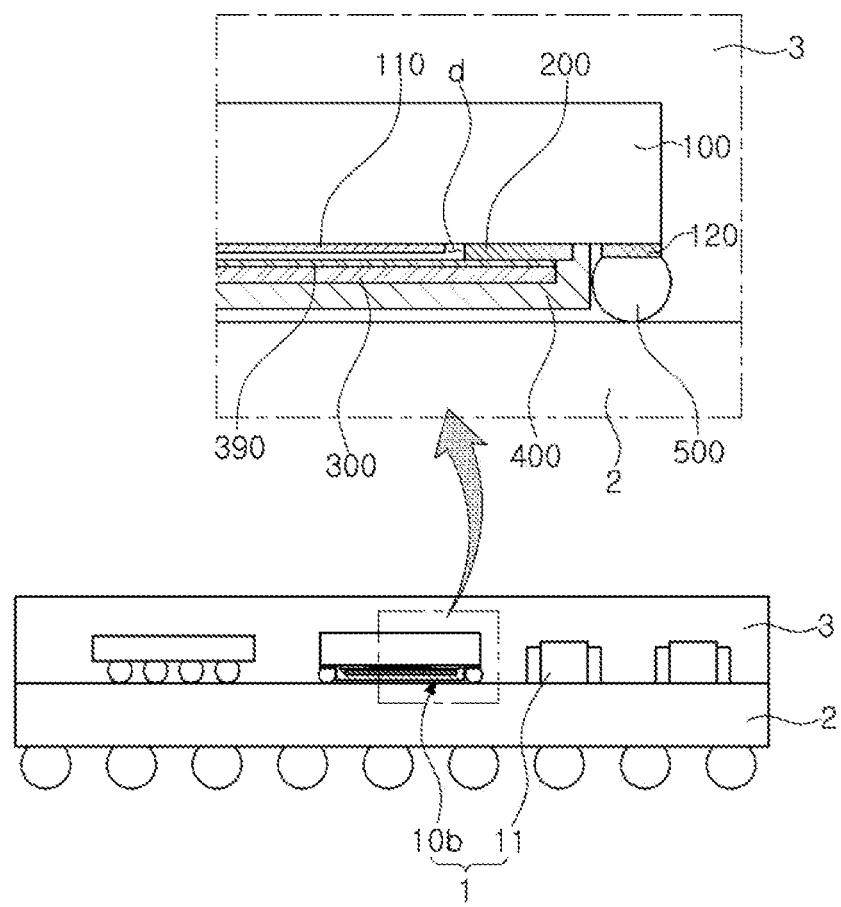

FIGS. 16 and 17 are schematic cross-sectional views illustrating acoustic wave device packages according to other exemplary embodiments in the present disclosure, respectively.

Referring to FIGS. 16 and 17, the acoustic wave device package may include a package board 2, a plurality of electronic elements 1 mounted on the package board 2, and an encapsulation component 3.

As the electronic element 1, any electronic component may be used as long as the electronic component may be mounted on the package board 2. For example, the electronic element 1 may be an active element or a passive element.

Further, the electronic elements 1 according to the present exemplary embodiment may include at least one acoustic wave device 10a and other elements 11. A case of using the acoustic wave device 10a illustrated in FIG. 4 is illustrated in FIG. 16, and a case of using the acoustic wave device 10d illustrated in FIG. 5 is illustrated in FIG. 17. However, the acoustic wave generator 110 is not limited thereto.

As the package board 2, various types of boards (for example, a ceramic board, a printed circuit board, a glass board, a flexible board, or the like) may be used, and at least one electronic element 1 may be mounted on at least one surface of the package board 2. Further, a plurality of external connection terminals 2a may be disposed on the other surface of the package board 2.

The encapsulation component 3 may encapsulate the electronic elements 1 mounted on the package board 2. Further, the encapsulation component 3 may be filled between the electronic elements 1 mounted on the package board 2 to prevent an electric short-circuit from occurring between the electronic elements 1, and fix the electronic elements 1 onto the package board 2 while enclosing outer portions of the electronic elements 1. As a result, the electronic elements 1 may be safely protected from external impacts.

The encapsulation component 3 may be formed by an injection molding method. For example, an epoxy mold compound (EMC) may be used as a material of the encapsulation component 3. However, a method of forming the encapsulation component 3 is not limited thereto. If it is necessary to form the encapsulation component 30, various methods, such as a method of compressing a semi-cured resin, or the like, may be used.

Referring to FIG. 16, the acoustic wave device package according to the present exemplary embodiment may include a protective member 300 disposed to be parallel to and spaced apart from the package board 2, an acoustic wave generator 110 disposed between the protective member 300 and the package board 2, and an acoustic wave device substrate 100.

Further, the acoustic wave generator 110 may be disposed between the protective member 300 and the acoustic wave device substrate 100.

Referring to FIG. 17, the acoustic wave device package according to the present exemplary embodiment may include an acoustic wave device substrate 100 and a package board 2 disposed to be parallel to each other, and a protective member 300 disposed between the acoustic wave device substrate 100 and the package board 2.

Further, an acoustic wave generator 110 may be disposed between the protective member 300 and the acoustic wave device substrate 100, and an airtight layer 390 may be disposed on one surface of the protective member 300 facing the acoustic wave generator 110.

In the acoustic wave device packages illustrated in FIGS. 16 and 17, a ground of the package board 2 and a ground of the acoustic wave device 10a or 10b may be electrically connected to each other through at least one connection terminal 500.

As set forth above, according to exemplary embodiments in the present disclosure, the acoustic wave device may significantly decrease deformation that occurs during the packaging of the acoustic wave device using the injection molding method.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave device comprising:
   a support component disposed on a substrate;
   an acoustic wave generator laterally spaced apart from the support component by a space portion and disposed on the substrate;
   a protective flat plate coupled to the support component and vertically spaced apart from the acoustic wave generator by the space portion, the protective flat plate contacting a portion of an upper surface of the support component such that a side surface of the protective flat plate and the upper surface of the support component form a step portion on an exterior of the protective flat plate and the support component;
   an electrode pad disposed on the substrate such that the support component is positioned laterally between the acoustic wave generator and the electrode pad; and
   a sealing component sealing the protective flat plate.

2. The acoustic wave device of claim 1, wherein the support component is disposed around an outer circumference of the acoustic wave generator.

3. The acoustic wave device of claim 1, wherein the protective flat plate covers an upper portion of the acoustic wave generator.

4. The acoustic wave device of claim 1, wherein the sealing component is disposed on the step portion.

5. The acoustic wave device of claim 1, wherein an airtight layer component is disposed on a bottom surface of the protective flat plate.

6. The acoustic wave device of claim 1, wherein the sealing component is a thin film containing at least one ingredient selected from the group consisting of silicon nitride ($Si_xN_y$), silicon dioxide ($SiO_2$), silicon oxy-nitride ($SiO_xN_y$), and silicon carbide (SiC).

7. The acoustic wave device of claim 1, further comprising a connection terminal electrically connected to the acoustic wave generator and disposed on the electrode pad.

8. The acoustic wave device of claim 7, wherein the connection terminal is disposed outside of the sealing component.

9. The acoustic wave device of claim 8, wherein a vertical distance from the surface of the substrate to an upper portion of the connection terminal is greater than a vertical distance from the surface of the substrate to the sealing component.

10. The acoustic wave device of claim 1, further comprising a connection terminal disposed on a second surface of the substrate opposing a first surface of the substrate on which the acoustic wave generator is disposed, wherein the connection terminal is electrically connected to the acoustic wave generator through a conductive via penetrating through the substrate.

11. The acoustic wave device of claim 1, further comprising an antenna formed on the substrate in a wiring patter form.

12. The acoustic wave device of claim 11, wherein the antenna is disposed inside or outside of the sealing component.

13. The acoustic wave device of claim 11, wherein the antenna is interposed between the substrate and the support component.

14. A method of manufacturing an acoustic wave device, the method comprising:
   preparing a substrate;
   disposing an acoustic wave generator on one surface of the substrate;
   forming a support component on the one surface of the substrate around a circumference of the acoustic wave generator;
   adhering a protective flat plate to the support component to form a space portion vertically spacing the protective flat plate apart from the acoustic wave generator and laterally spacing the support component apart from the acoustic wave generator, and to form a step portion on a side surface of the protective flat plate and an upper surface of the support component;
   forming an electrode pad on the one surface of the substrate such that the support component is positioned laterally between the acoustic wave generator and the electrode pad; and
   forming a sealing component to seal the protective flat plate and the support component.

15. The method of claim 14, further comprising forming a connection terminal spaced apart from an exterior of the sealing component and electrically connected to the acoustic wave generator on either one or both of the electrode pad and another surface of the substrate opposing the one surface.

16. The method of claim 14, wherein the sealing component is a thin film.

17. The method of claim 14, wherein the forming of the sealing component comprises forming the sealing component on the step portion.

\* \* \* \* \*